United States Patent
Sumida (10) Patent No.: US 10,194,523 B2
(45) Date of Patent: Jan. 29, 2019

(54) CIRCUIT ASSEMBLY, ELECTRICAL JUNCTION BOX, AND MANUFACTURING METHOD FOR CIRCUIT ASSEMBLY

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Tatsuya Sumida, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 15/542,783

(22) PCT Filed: Dec. 28, 2015

(86) PCT No.: PCT/JP2015/086470
§ 371 (c)(1),
(2) Date: Jul. 11, 2017

(87) PCT Pub. No.: WO2016/114098
PCT Pub. Date: Jul. 21, 2016

(65) Prior Publication Data
US 2018/0027646 A1    Jan. 25, 2018

(30) Foreign Application Priority Data
Jan. 16, 2015    (JP) ................................. 2015-006684

(51) Int. Cl.
*H05K 1/02*    (2006.01)
*H05K 3/10*    (2006.01)
(Continued)

(52) U.S. Cl.
CPC ............. *H05K 1/0204* (2013.01); *H05K 3/10* (2013.01); *H05K 7/1432* (2013.01); *H05K 7/209* (2013.01);
(Continued)

(58) Field of Classification Search
CPC .... H05K 1/0204; H05K 7/20854; H05K 3/10; H05K 7/20409; H05K 7/20418;
(Continued)

(56) References Cited

U.S. PATENT DOCUMENTS

| | | | | |
|---|---|---|---|---|
| 7,514,629 B2* | 4/2009 | Sasaki | ..................... | H02G 3/086 174/50 |
| 2003/0137813 A1* | 7/2003 | Onizuka | .............. | H05K 1/0263 361/777 |

(Continued)

FOREIGN PATENT DOCUMENTS

| JP | 2003164039 | 6/2003 |
|---|---|---|
| JP | 2005-117719 | 4/2005 |

(Continued)

OTHER PUBLICATIONS

Search Report for PCT/JP2015/086470, dated Mar. 15, 2016.

*Primary Examiner* — Anatoly Vortman
*Assistant Examiner* — Stephen Sul
(74) *Attorney, Agent, or Firm* — Honigman Miller Schwartz and Cohn LLP (57) ABSTRACT

A circuit assembly includes a circuit board having an insulating board in which a conductive path is formed on an insulating plate and a plurality of busbars that are bonded to one side of the insulating board, an insulating layer that is printed to the plurality of busbars so as to couple adjacent ones of the plurality of busbars to each other, a heat dissipation member on which the insulating layer is placed and which is configured to dissipate heat conducted from the (Continued)

insulating layer, a fixing member that is configured to fix the circuit board and the heat dissipation member to each other in a state in which the insulating layer is sandwiched between the heat dissipation member and the plurality of busbars.

8 Claims, 8 Drawing Sheets

(51) Int. Cl.
    *H05K 7/20*     (2006.01)
    *H05K 7/14*     (2006.01)
    *H05K 3/00*     (2006.01)
    *H05K 3/20*     (2006.01)
    *H05K 3/40*     (2006.01)

(52) U.S. Cl.
    CPC ....... *H05K 7/20854* (2013.01); *H05K 1/0209* (2013.01); *H05K 3/0064* (2013.01); *H05K 3/202* (2013.01); *H05K 3/4007* (2013.01); *H05K 2201/0382* (2013.01); *H05K 2201/062* (2013.01); *H05K 2201/066* (2013.01); *H05K 2201/10272* (2013.01); *H05K 2201/10409* (2013.01)

(58) Field of Classification Search
    CPC ................. H05K 7/2049; H05K 7/209; H05K 2201/10393; H05K 7/205; H05K 7/20445

USPC .......... 361/720, 704, 688, 736, 679.01, 748, 361/707, 709

See application file for complete search history.

(56) References Cited

U.S. PATENT DOCUMENTS

| | | | |
|---|---|---|---|
| 2004/0160754 A1* | 8/2004 | Kobayashi | H05K 1/0203 361/783 |
| 2005/0099778 A1 | 5/2005 | Nakanishi | |
| 2006/0268527 A1* | 11/2006 | Tanaka | H05K 1/0201 361/722 |
| 2008/0055821 A1* | 3/2008 | Sasaki | H01R 13/5227 361/601 |
| 2010/0254093 A1* | 10/2010 | Oota | B60R 16/0239 361/720 |
| 2015/0029674 A1* | 1/2015 | Ko | H05K 1/0204 361/720 |
| 2015/0181766 A1* | 6/2015 | Lu | H01L 23/49811 361/715 |
| 2015/0230352 A1 | 8/2015 | Hashikura | |
| 2016/0329774 A1* | 11/2016 | Araki | H05K 1/0201 |

FOREIGN PATENT DOCUMENTS

| | | |
|---|---|---|
| JP | 2005151617 A | 6/2005 |
| JP | 2014-057390 | 3/2014 |

* cited by examiner

CIRCUIT ASSEMBLY, ELECTRICAL JUNCTION BOX, AND MANUFACTURING METHOD FOR CIRCUIT ASSEMBLY

CROSS-REFERENCE TO RELATED APPLICATIONS

This application is the U.S. national stage of PCT/JP2015/086470 filed on Dec. 28, 2015, which claims priority of Japanese Patent Application No. JP2015-006684 filed Jan. 16, 2015.

FIELD OF THE INVENTION

The present invention relates to a circuit assembly.

BACKGROUND

Conventionally, circuit assemblies are known in which an insulating board which has conductive paths formed thereon and to which busbars are bonded is placed on a heat dissipation member. In a circuit assembly disclosed in JP 2005-15167A, a circuit member formed by bonding a plurality of busbars to a control circuit board and mounting electronic components thereon is bonded on top of a heat dissipation member.

Control circuit boards such as that disclosed in JP 2005-15167A are generally formed to have a small thickness. Therefore, a circuit member in which busbars are bonded to such a control circuit board has low stiffness and is prone to deformation, and there are problems in that handling is not easy, and a gap will be formed between the circuit member and the heat dissipation member due to deformation of the circuit member and cause a decrease in heat dissipation properties. Moreover, the JP 2005-15167A discloses, during fixation of the circuit member to the heat dissipation member, the circuit member is pressed against the heat dissipation member. There is a problem in that when the circuit member is pressed against the heat dissipation member, if the pressure applied to the adhesive via the circuit member is nonuniform, the adhesion of the adhesive will be insufficient depending on the location, resulting in a decrease in heat dissipation properties.

SUMMARY OF INVENTION

The present invention was accomplished based on the above-described circumstances, and it is an object thereof to provide a circuit assembly that enables suppression of a decrease in heat dissipation properties while facilitating the handling of a circuit board.

A circuit assembly of the present invention includes a circuit board having an insulating board in which a conductive path is formed thereon and a plurality of busbars that are bonded to one side of the insulating board; an insulating layer that is printed to the plurality of busbars so as to couple adjacent ones of the plurality of busbars to each other; a heat dissipation member on which the insulating layer is placed and which is configured to dissipate heat conducted from the insulating layer; and a fixing member that is configured to fix the circuit board and the heat dissipation member to each other in a state in which the insulating layer is sandwiched between the heat dissipation member and the plurality of busbars.

A method for manufacturing a circuit assembly of the present invention includes the steps of forming a circuit board by bonding a plurality of busbars to an insulating board in which a conductive path is formed thereon; printing an insulating layer to the plurality of busbars so as to couple adjacent ones of the plurality of busbars to each other; placing the insulating layer on a heat dissipation member; and fixing the circuit board and the heat dissipation member to each other with a fixing member in a state in which the insulating layer is sandwiched between the heat dissipation member and the plurality of busbars.

With the present configuration, the insulating layer is printed to the plurality of busbars so as to couple adjacent ones of the plurality of busbars of the circuit board to each other. Thus, the stiffness of the circuit board is increased, so that the handling thereof can be facilitated. Also, formation of a gap between the circuit board and the heat dissipation member due to deformation of the circuit board is unlikely to occur, so that a decrease in heat dissipation properties can be suppressed. Moreover, since the stiffness of the circuit board is increased by the insulating layer, deformation of the circuit board is unlikely to occur, so that it is easy to bring the circuit board into intimate contact with the heat dissipation member. Accordingly, even when an adhesive is not used, the circuit board and the heat dissipation member can be fixed to each other with the fixing member, and therefore, unlike a case where bonding is performed by using an adhesive, a decrease in heat dissipation properties that will occur when adhesion is insufficient depending on the location can be suppressed. Therefore, it is possible to suppress a decrease in heat dissipation properties while facilitating the handling of the circuit board.

The following embodiments are preferred as embodiments of the present invention.

The insulating layer may have a filling portion with which a gap between the plurality of busbars is filled.

With this configuration, the stiffness of the circuit board can be increased even more because the filling portion is disposed between the plurality of busbars.

An electronic component may be mounted on the circuit board, and the filling portion may be disposed in the vicinity of the electronic component.

With this configuration, heat conductivity from the busbars to the insulating layer can be increased by the filling portion.

Electronic components constituted by a plurality of low-heat generating components and a plurality of high-heat generating components that generate more heat than the plurality of low-heat generating components may be mounted on the circuit board, and a heat insulating groove may be formed in the circuit board at a location between the plurality of low-heat generating components and the plurality of high-heat generating components, the heat insulating groove passing through the circuit board and the insulating layer.

With this configuration, heat transfer from the high-heat generating components to the low-heat generating components side via the circuit board and the insulating layer can be suppressed by the heat insulating groove.

A heat insulating recess that is continuous with the heat insulating groove may be formed in the heat dissipation member.

With this configuration, heat transfer from the high-heat generating components to the low-heat generating components side via the heat dissipation member can be suppressed by the heat insulating recess.

A heat dissipation grease may be disposed in a region which is located between the insulating layer and the heat dissipation member and over which at least one of the plurality of high-heat generating components is disposed.

With this configuration, heat conductivity between the insulating layer and the heat dissipation member can be increased by the heat dissipation grease, so that heat of the high-heat generating components can be efficiently conducted to the heat dissipation member.

The fixing member may be a screw.

Providing the circuit board with the insulating layer makes it unlikely for deformation, such as warping and waviness, of the circuit board to occur and makes it easy to bring the circuit board into intimate contact with the heat dissipation member. As a result, it is possible to fix the circuit board and the heat dissipation member to each other while increasing heat dissipation properties by simply tightening the screw.

An electrical junction box includes the circuit assembly and a case that accommodates the circuit assembly.

According to the present invention, it is possible to suppress a decrease in heat dissipation properties while facilitating the handling of a circuit board.

DETAILED DESCRIPTION OF THE PREFERRED EMBODIMENTS

An embodiment of the present invention will be described with reference to FIGS. 1 to 7.

An electrical junction box 10 is disposed, for example, on a power supply path between a power supply such as a battery of a vehicle and loads constituted by in-vehicle electrical equipment, such as a lamp and a wiper, and a motor, and can be used for, for example, a DC-DC converter, an inverter, or the like. An upper-lower direction in the following description is based on the direction in FIG. 1.

Electrical Junction Box 10

Figure 1:
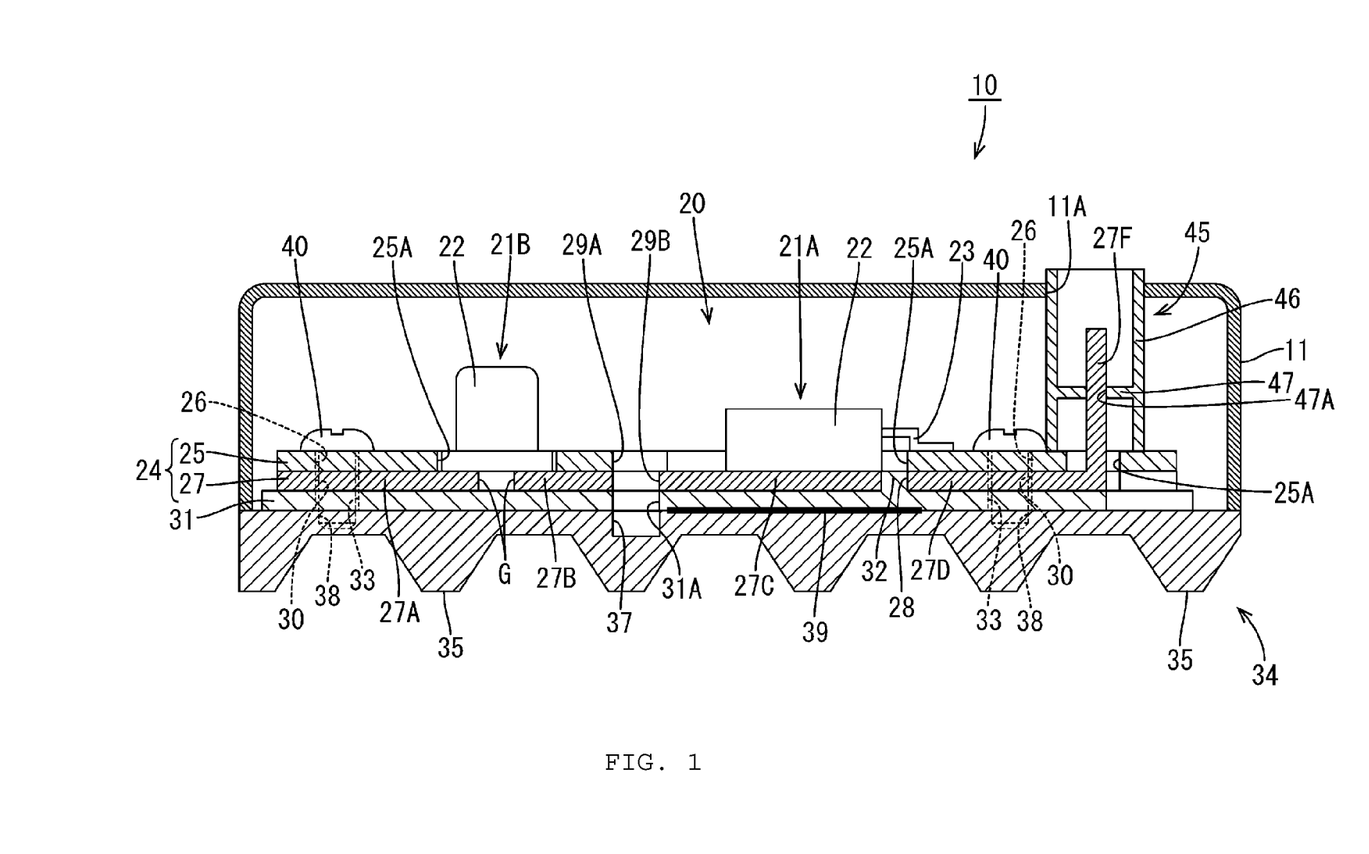
FIG. 1 is a vertical cross-sectional view showing an electrical junction box of an embodiment.

As shown in FIG. 1, the electrical junction box 10 includes a circuit assembly 20 and a shield case 11 (an example of a "case") that covers the circuit assembly 20. The shield case 11 is box-shaped and is formed by punching and bending, or casting, a metal plate made of aluminum or the like.

Circuit Assembly 20

The circuit assembly 20 includes a circuit board 24 on which a plurality of electronic components 21A and 21B are mounted, an insulating layer 31 that is printed to a lower surface (one side) of the circuit board 24, a heat dissipation member 34 on which the insulating layer 31 is placed, and fixing members 40 that fix the circuit board 24 and the heat dissipation member 34 to each other and that are constituted by screws.

The plurality of electronic components 21A and 21B include a high-heat generating component 21A and a low-heat generating component 21B that generates less heat than the high-heat generating component 21A. The high-heat generating component 21A is constituted by, for example, a switching element (FET (Field Effect Transistor) or the like), a resistor, a coil, or the like. The low-heat generating component 21B is constituted by, for example, a capacitor (aluminum electrolytic capacitor or the like). Each of the electronic components 21A and 21B has a main body 22 and a plurality of lead terminals 23 that are led from the main body 22.

Circuit Board 24

The circuit board 24 has, for example, a rectangular shape and is configured by bonding an insulating board 25 and a busbar board 27 to each other using an adhesive member (e.g., a pressure-sensitive adhesive tape, an adhesive sheet, an adhesive, or the like). In the insulating board 25, conductive paths (not shown) made of copper foil are formed on the insulating board 25 made of an insulating material and having a small thickness using printed wiring. Due to the small thickness of the insulating board 25, the level difference between the upper surface of the insulating board 25 and the upper surface of busbars 27A to 27D is small, and thus, during soldering of the terminals of the electronic components to the conductive paths of the insulating board 25 and the busbars 27A to 27D, the connecting operation is advantageously facilitated. However, on the other hand, since the insulating board 25 is thin and prone to deformation, the stiffness of the circuit board 24 is low.

The insulating board 25 has insertion holes 25A into which the electronic components 21A and 21B and a terminal 27F of the busbar board 27 are inserted as well as a plurality of circular through holes 26 into which shaft portions of the fixing members 40 are inserted, the insertion holes 25A and the through holes 26 passing through the insulating board 25. The plurality of through holes 26 are formed, for example, at positions (e.g. four corner positions) that are close to peripheral edge portions of the circuit board 24 (on an outer side of the electronic components 21A and 21B); however, the positions at which the through holes 26 are formed are not limited to these positions, and the through holes 26 may also be formed at other positions and fixed with the fixing members 40.

The busbar board 27 is constituted by the plurality of plate-shaped busbars 27A to 27D that are arranged in the same plane, spaced apart from one another. The plurality of busbars 27A to 27D are formed by punching a metal plate material made of copper, a copper alloy, or the like in accordance with the shape of the conductive paths. The busbars 27A and 27D have a plurality of circular through holes 30 into which the shaft portions of the fixing members 40 are inserted, the through holes 30 passing through the busbars 27A and 27D at positions that are continuous with the respective through holes 26 of the insulating board 25. An end portion of the busbar 27D is bent upward at right angles and constitutes the terminal 27F that is connectable to the outside. The terminal 27F is held in a connector housing 45 made of a synthetic resin, and thus a connector that can be fitted to a counterpart connector, which is not shown, is formed. The connector housing 45 has a hood portion 46 that opens in a rectangular tube-shape, and an inner wall 47 that closes the inner side of the hood portion 46. The inner wall 47 has a terminal insertion hole 47A into which the terminal 27F is inserted, the terminal insertion hole 47A passing through the inner wall 47. A leading end side of the hood portion 46 is led to the outside from an opening 11A that is formed in the shield case 11, passing therethrough.

Among the gaps between the plurality of busbars 27A to 27D, the gap at a position under (in the vicinity of) the lead terminals 23, the position being contained in the region of the high-heat generating component 21A, constitutes a filling groove 28 that is filled with the resin of the insulating layer 31. Note that the position of the filling groove 28 is not limited to the position under the lead terminals 23, and it is also possible to form the filling groove 28 at, for example, a position under the main body 22 or a position other than the positions under the main body 22 and the lead terminals 23 and to which heat of the high-heat generating component 21A is easily conducted.

Heat insulating grooves 29A and 29B are formed in the insulating board 25 and the busbar board 27, respectively, passing therethrough at a location between the high-heat generating component 21A and the low-heat generating component 21B. The heat insulating grooves 29A and 29B extend for a certain length in a direction that is orthogonal to a direction connecting the low-heat generating component 21B and the high-heat generating component 21A. The lengths and the widths of the heat insulating grooves 29A and 29B are set to such dimensions that make it possible to suppress heat transfer from the high-heat generating component 21A to the low-heat generating component 21B. In the present embodiment, for example, the lengths of the heat insulating grooves 29A and 29B are set to be larger than the length of a side surface of the main body 22 in a direction along the heat insulating grooves 29A and 29B, so that heat transfer from the entire side surface of the main body 22 can be suppressed. With regard to the electronic component 21A, the lead terminals 23 are soldered to the conductive paths of the insulating board 25, and a terminal (not shown) at a bottom surface of the main body 22 of this electronic component 21A is soldered to an upper surface of the busbar 27C.

Insulating Layer 31

The insulating layer 31 is formed on a rear surface of the busbars 27A to 27D, and the material and thickness thereof are such that the insulating layer 31 has a degree of strength that enables suppression of deformation, such as warping and waviness, of the circuit board 24. In the present embodiment, the insulating layer 31 is formed by curing a thermosetting resin in viscous form (paste form) that can be printed to any portions as needed, and is printed so as to have a constant thickness over the entire rear surface of the busbars 27A to 27D. The insulating layer 31 is in intimate contact with the rear surface of the plurality of busbars 27A to 27D and couples adjacent ones of the busbars 27A to 27D to each other on the rear surface side of the plurality of busbars 27A to 27D. Moreover, the filling groove 28, which is the gap between the busbars 27C and 27D, is filled with the insulating layer 31. The insulating layer 31 that is disposed in the filling groove 28 serves as a filling portion 32 and is positioned in the vicinity of the high-heat generating component 21A.

The insulating layer 31 has a heat insulating groove 31A at a location between the high-heat generating component 21A and the low-heat generating component 21B, the heat insulating groove 31A passing through the insulating layer 31. The heat insulating groove 31A is formed at a position that is underneath and continuous with the heat insulating grooves 29A and 29B. In the present embodiment, the heat insulating grooves 29A, 29B, and 31A have the same length in the direction that is orthogonal to the direction connecting the low-heat generating component 21B and the high-heat generating component 21A; however, the heat insulating grooves 29A, 29B, and 31A may have different lengths. The insulating layer 31 has a plurality of through holes 33 into which the shaft portions of the fixing members 40 are inserted, the through holes 33 being formed at positions that are underneath and continuous with the corresponding through holes 26 and 30.

An adhesive having high heat conductivity and also having insulating properties is used for the insulating layer 31. In the present embodiment, a thermosetting resin is used. For example, it is possible to use an epoxy adhesive. Note that the insulating layer is not limited to thermosetting resins, and various resins can be used. For example, a resin that cures at a normal temperature and a thermoplastic resin may also be used.

Heat Dissipation Member 34

The heat dissipation member 34 is made of a metal having high heat conductivity, such as aluminum or an aluminum alloy, is shaped through aluminum die casting or the like, and has a flat upper surface and a plurality of heat dissipation fins 35 that are lined up like comb teeth on a lower surface side. A heat insulating recess 37 is formed in the upper surface of the heat dissipation member 34. The heat insulating recess 37 is formed at a position that is underneath and continuous with the heat insulating grooves 29A, 29B, and 31A, and heat insulation is achieved by air within a heat insulating space that is formed by the heat insulating grooves 29A, 29B, and 31A and the heat insulating recess 37. The heat dissipation member 34 has a plurality of threaded holes 38 for fastening of the circuit board 24 with screws. The threaded holes 38 enable the fastening with screws by each threaded hole 38 mating with an outer circumference of the shaft portion of a corresponding one of the fixing members 40, and each threaded hole 38 is formed at a position that is continuous with the corresponding through holes 26, 30, and 33.

A description of a method for manufacturing the circuit assembly 20 is given below.

Board Forming Step

Figure 2:
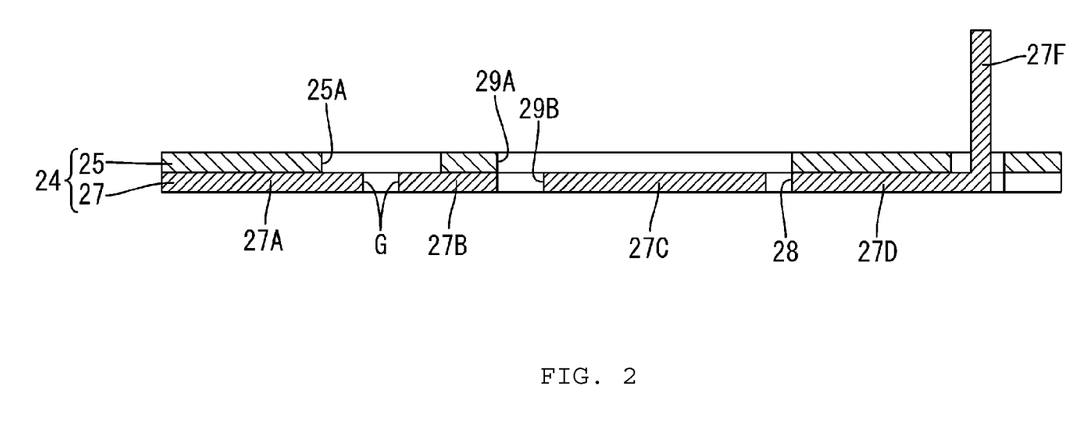
FIG. 2 is a vertical cross-sectional view showing a circuit board.

The busbars 27A to 27D are formed by punching a metal plate material. Then, the terminal 27F of the busbar 27D is bent, and the plurality of busbars 27A to 27D are bonded to the insulating board 25 using an adhesive member to form the circuit board 24 (FIG. 2).

Insulating Layer Forming Step

Figure 3:
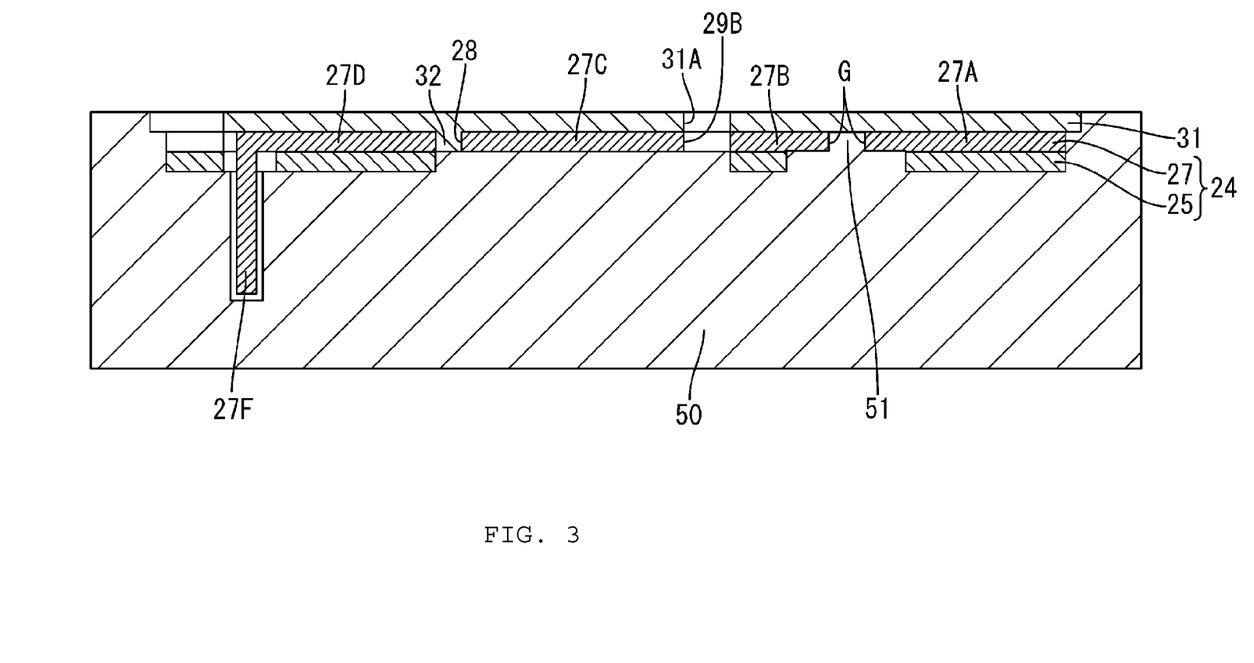
FIG. 3 is a vertical cross-sectional view showing a state in which an insulating layer is printed to a circuit board that is placed on a jig.

Next, as shown in FIG. 3, the circuit board 24 is inverted and placed at a predetermined position on a jig 50, a thermosetting resin in paste form is printed to regions of the rear surface (upper surface in FIG. 3) of the busbars 27A to 27D excluding the heat insulating grooves 29A and 29B, and then heated and pressed using a pressing machine or the like to cure the insulating layer 31. Note that protrusions and recessions that fit the protrusions and recessions of the circuit board 24 are formed in an upper surface of the jig 50 so as to prevent leakage during application of the resin. The jig 50 has a protruding portion 51 that is to be inserted into a gap G between the busbars 27A and 27B other than the filling groove 28 and the heat insulating groove 31A.

Figure 4:
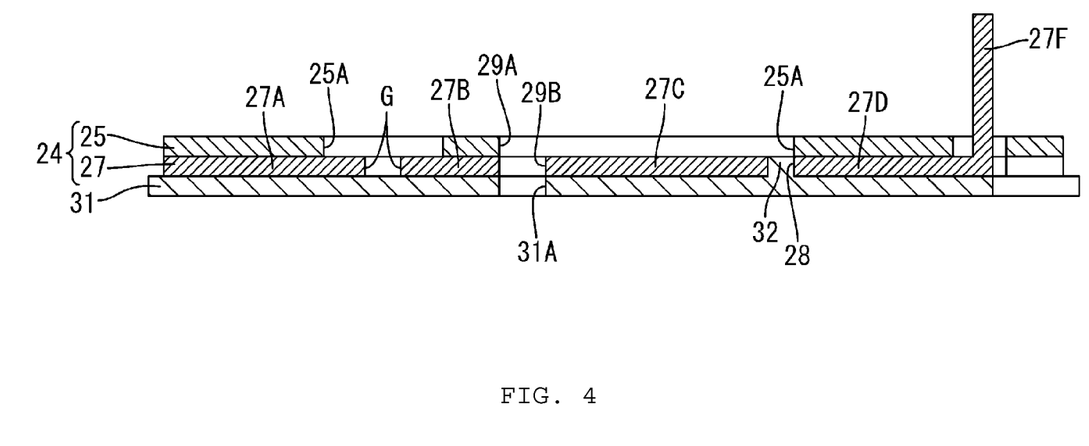
FIG. 4 is a vertical cross-sectional view showing the circuit board on which the insulating layer is formed.

After the thermosetting resin cures, thereby forming the insulating layer 31, the jig is removed, and thus, a circuit member into which the circuit board 24 and the insulating layer 31 are integrated is formed (FIG. 4). In this state, adjacent ones of the busbars 27A to 27D are coupled to each other by the insulating layer 31 on the rear surface side of the busbars 27A to 27D, and the stiffness of the circuit board 24 is increased by the insulating layer 31.

Component Mounting Step

Figure 5:
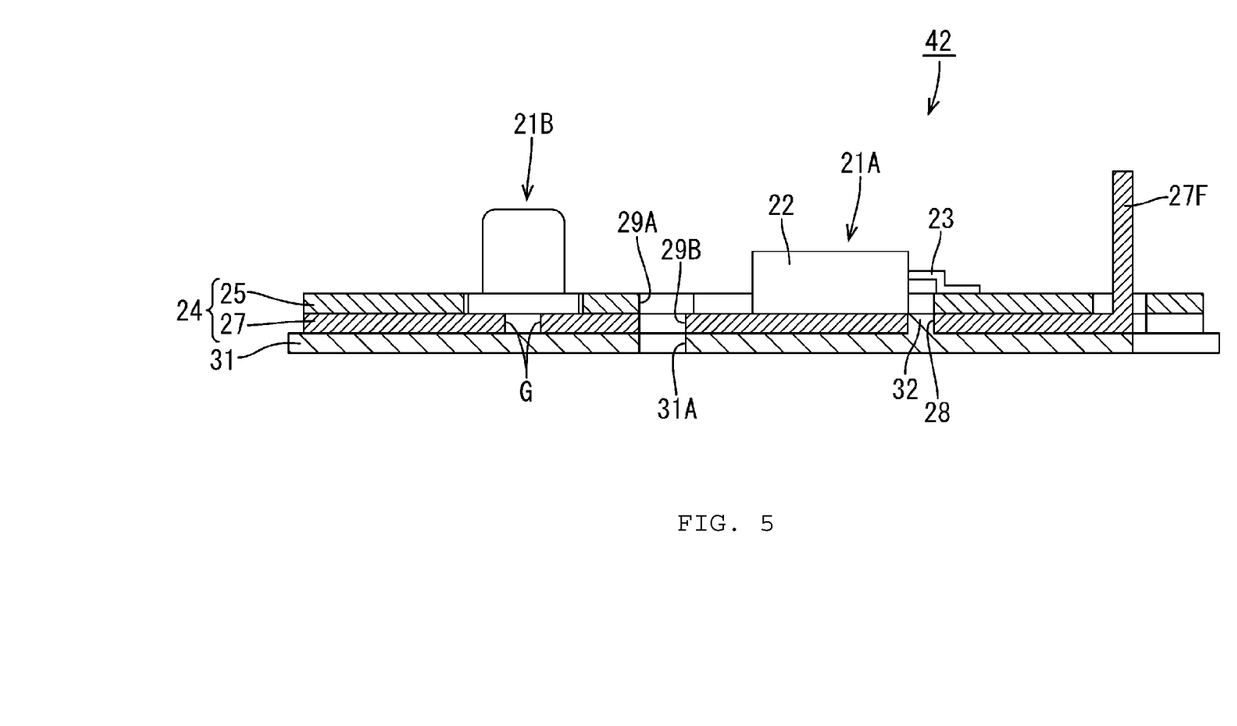
FIG. 5 is a vertical cross-sectional view showing a circuit unit in which electronic components are mounted.

Next, reflow soldering is performed in which a solder paste is deposited between the conductive paths of the circuit board 24 and the lead terminals 23 of the electronic components 21A and 21B, for example, and then passed through a reflow oven. As a result, a circuit unit 42 in which the electronic components 21A and 21B are mounted on the circuit board 24 is formed (FIG. 5).

Heat Dissipation Member Attaching Step

Figure 6:
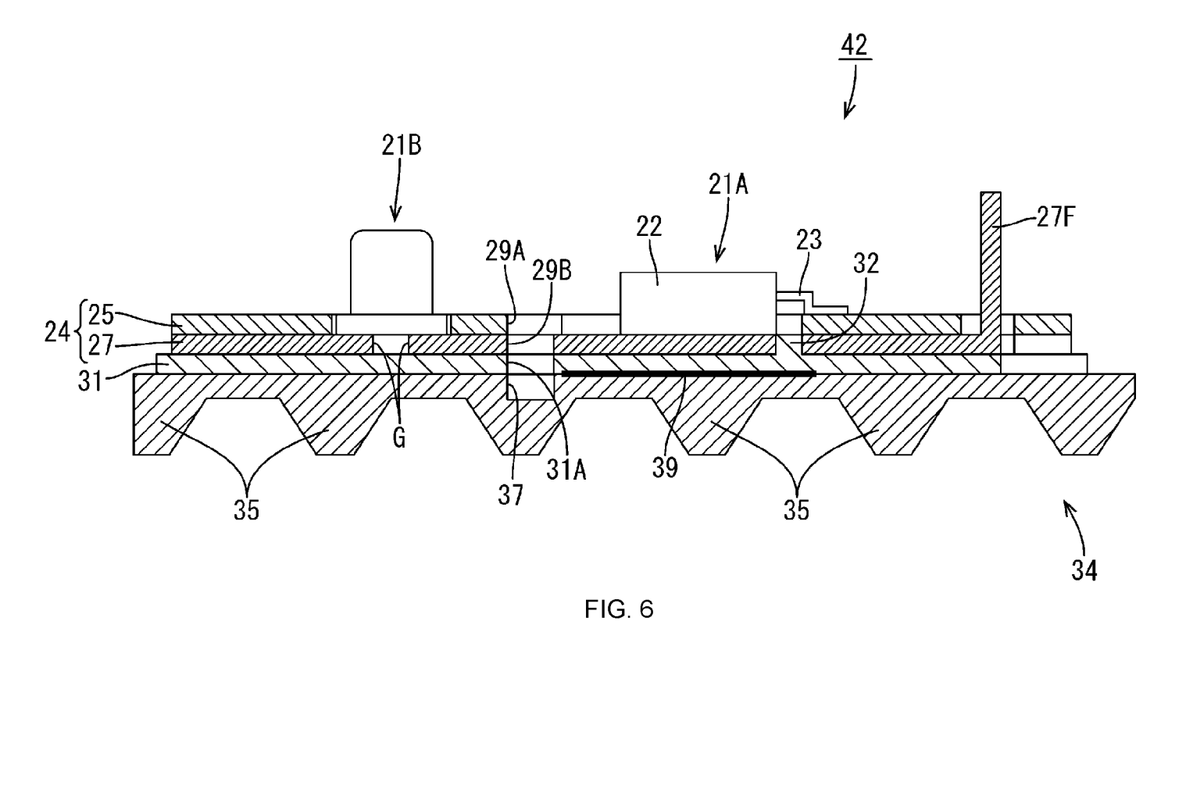
FIG. 6 is a vertical cross-sectional view showing a state in which the circuit unit is placed on a heat dissipation member to which a heat dissipation grease is applied.
Figure 7:
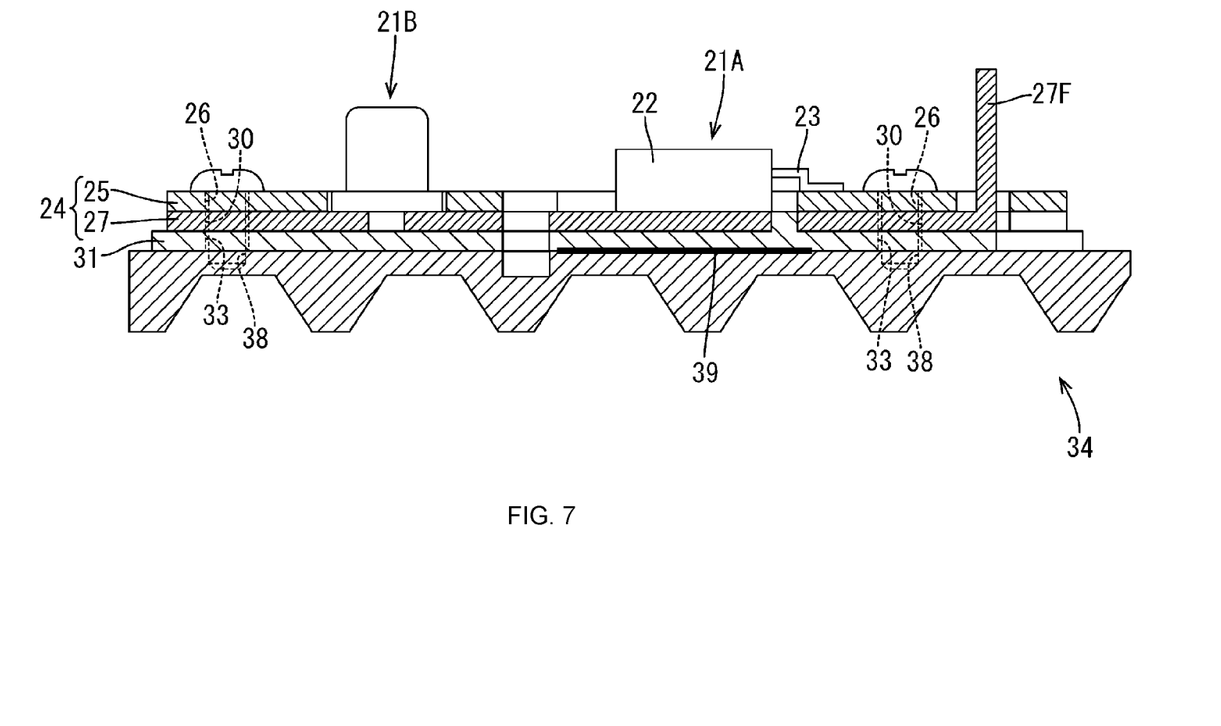
FIG. 7 is a vertical cross-sectional view showing a circuit assembly.

Next, a heat dissipation grease 39 is applied to a portion of the upper surface of the heat dissipation member 34 that contains the region of the high-heat generating component 21A, and the circuit unit 42 is placed on the upper surface of the heat dissipation member 34 (FIG. 6). Then, the fixing members 40 are inserted into the through holes 26, 30, and 33 of the circuit board 24 and the insulating layer 31 and screwed into the threaded holes 38 of the heat dissipation member 34. As a result, the insulating layer 31 is sandwiched between the heat dissipation member 34 and the busbars 27A to 27D, and thus, the circuit assembly 20 is formed (FIG. 7).

The shield case 11 is put over the upper surface side of the circuit assembly 20, and the shield case 11 is fastened to the heat dissipation member 34 with screws, which are not shown. Thus, the electrical junction box 10 is formed (FIG. 1). The electrical junction box 10 is disposed on a path from a power supply of a vehicle to a load.

According to the above-described embodiment, the following effects are achieved.

According to the present embodiment, the insulating layer 31 is printed to the plurality of busbars 27A to 27D so as to couple adjacent ones of the plurality of busbars 27A to 27D to each other. Thus, the stiffness of the circuit board 24 is increased, so that the handling of the circuit board 24 can be facilitated. Also, deformation, such as warping and waviness, of the circuit board 24 is unlikely to occur, and formation of a gap between the circuit board 24 and the heat dissipation member 34 is unlikely to occur, so that a decrease in heat dissipation properties can be suppressed. Moreover, since the stiffness of the circuit board 24 is increased by the insulating layer 31, deformation, such as warping and waviness, of the circuit board 24 is unlikely to occur, so that it is easy to bring the circuit board 25 into intimate contact with the heat dissipation member 34. Accordingly, as in the present embodiment, even when the circuit board 24 and the heat dissipation member 34 are not bonded to each other using an adhesive, the circuit board 24 and the heat dissipation member 34 can be fixed to each other with the fixing members 40, so that a decrease in heat dissipation properties that will occur when adhesion of the adhesive is insufficient depending on the location can be suppressed. Therefore, it is possible to suppress a decrease in heat dissipation properties while facilitating the handling of the circuit board 24.

Moreover, the insulating layer 31 has the filling portion 32 with which the filling groove 28 (gap) between the plurality of busbars 27C and 27D is filled.

With this configuration, the stiffness of the circuit board 24 can be increased even more because the filling groove 28 between the busbars 27A to 27D is filled with the filling portion 32.

Moreover, the electronic components 21A and 21B are mounted on the circuit board 24, and the filling portion 32 is disposed in the vicinity of the electronic components 21A and 21B.

With this configuration, heat conductivity from the electronic components 21A and 21B to the insulating layer 31 can be increased by the filling portion 32 in the vicinity of the electronic components 21A and 21B.

Moreover, the electronic components 21A and 21B constituted by a plurality of said low-heat generating components 21B and a plurality of said high-heat generating components 21A that generate more heat than the plurality of low-heat generating components 21B are mounted on the circuit board 24, and the heat insulating grooves 29A, 29B, and 31A, which pass through the circuit board 24 and the insulating layer, are formed in the circuit board 24 at a location between the plurality of low-heat generating components 21B and the plurality of high-heat generating components 21A.

With this configuration, heat transfer from the high-heat generating components 21A to the low-heat generating components 21B side via the circuit board 24 and the insulating layer 31 can be suppressed by the heat insulating grooves 29A, 29B, and 31A. Accordingly, deterioration of the low-heat generating components 21B that are sensitive to heat, such as an aluminum electrolytic capacitor, can be suppressed.

Moreover, the heat dissipation member 34 has the heat insulating recess 37 that is continuous with the heat insulating grooves 29A, 29B, and 31A.

With this configuration, heat transfer from the high-heat generating components 21A to the low-heat generating components 21B side via the heat dissipation member 34 can be suppressed by the heat insulating recess 37.

Moreover, the heat dissipation grease 39 is disposed in a region which is located between the insulating layer 31 and the heat dissipation member 34 and over which at least one of the plurality of high-heat generating components 21A is disposed.

With this configuration, the heat dissipation grease 39 can increase heat conductivity between the insulating layer 31 and the heat dissipation member 34. Thus, heat of the high-heat generating components 21A can be efficiently conducted to the heat dissipation member 34.

Moreover, the fixing members 40 are screws.

Providing the circuit board 24 with the insulating layer 31 makes it unlikely for deformation, such as warping and waviness, of the circuit board 24 to occur and makes it easy to bring the circuit board 24 into intimate contact with the heat dissipation member 34. Therefore, it is possible to fix the circuit board 24 and the heat dissipation member 34 to each other while increasing the heat dissipation properties by simply tightening the fixing members 40. Moreover, a force that is produced during fastening by screwing the fixing members 40 can be received by the insulating layer 31.

Other Embodiments

The present invention is not limited to the embodiment that has been described above with reference to the drawings, and embodiments such as those described below, for example, are also included in the technical scope of the present invention.

(1) The electronic components 21A and 21B are not limited to those in which lead terminals 23 are led from a main body 22, and may also be leadless terminals having no lead terminals 23. For example, all of the terminals of the electronic components 21A and 21B (FET (Field Effect Transistor) or the like) may be formed on the surfaces of the main bodies 22.

(2) Although screws are employed as the fixing members 40, the present invention is not limited to this configuration. For example, the circuit board 24 and the heat dissipation member 34 may be fixed to each other by holding them from both sides using rivets, or the circuit board 24 and the heat dissipation member 34 may be fixed to each other by holding them from both sides using clips.

(3) Although a configuration in which the entire region of a given electronic component 21A is disposed over the heat dissipation grease 39 has been described, the present invention is not limited to this configuration, and a configuration may also be adopted in which at least a portion of the electronic component 21A is disposed over the heat dissipation grease 39.

(4) Although a configuration in which heat-curing of the insulating layer 31 and reflow soldering of the electronic components 21A and 21B are performed in separate steps has been described, the heat-curing of the insulating layer 31 and the reflow soldering of the electronic components 21A and 21B may be performed in the same step.

Figure 8:
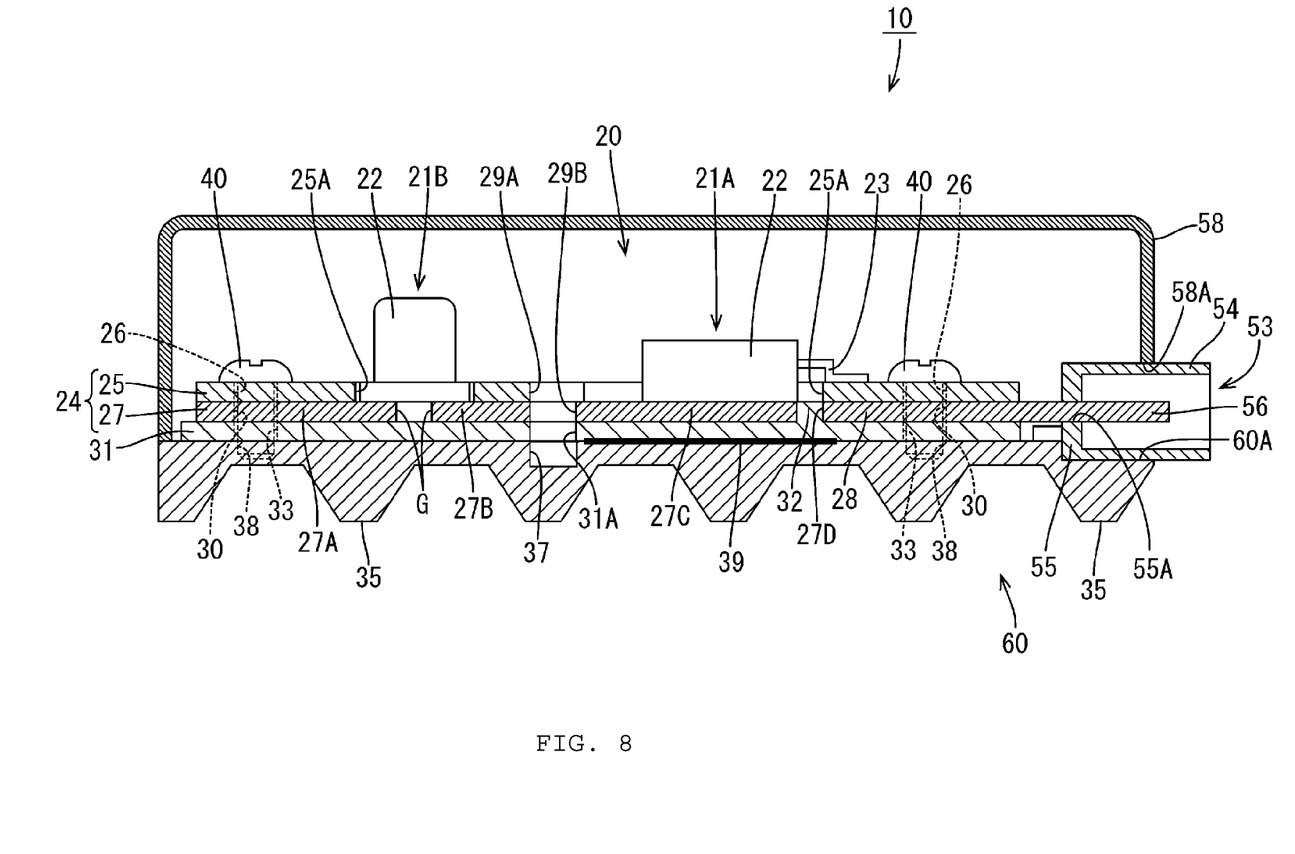
FIG. 8 is a vertical cross-sectional view showing an electrical junction box of another embodiment.

(5) Although the end portion of the busbar 27D of the foregoing embodiment is the bent terminal 27F, the present invention is not limited to this configuration. For example, as shown in FIG. 8, the end portion of the busbar 27D may be a terminal 56 that extends straight (in a horizontal direction that is in the same plane with the busbar 27D) from the busbar 27D. In this case, the terminal 56 is held in a connector housing 53 made of a synthetic resin, thereby forming a connector that can be fitted to a counterpart connector. The connector housing 53 has a hood portion 54 that opens in a rectangular tube-shape and an inner wall 55 that closes the hood portion 54, and the inner wall 55 has a terminal insertion hole 55A into which the terminal 56 is inserted, the terminal insertion hole 55A passing through the inner wall 55. A heat dissipation member 60 underneath the connector housing 53 has a recess 60A on which a lower portion of the connector housing 53 is placed. A leading end side of the hood portion 54 is led to the outside from an opening 58A that is formed in a shield case 58, passing therethrough.

The invention claimed is:

1. A circuit assembly comprising:
    a circuit board having an insulating board and a plurality of busbars that are bonded to one side of the insulating board;
    an insulating layer that is printed to the plurality of busbars so as to couple adjacent ones of the plurality of busbars to each other;
    a heat dissipation member on which the insulating layer is placed and which is configured to dissipate heat conducted from the insulating layer; and
    a fixing member that is configured to fix the circuit board and the heat dissipation member to each other in a state in which the insulating layer is sandwiched between the heat dissipation member and the plurality of busbars,
    a plurality of low-heat generating components and a plurality of high-heat generating components that generate more heat than the plurality of low-heat generating components are mounted on the circuit board, and
    a heat insulating groove is formed in the circuit board at a location between the plurality of low-heat generating components and the plurality of high-heat generating components, the heat insulating groove passing through the circuit board and the insulating layer, and
    a heat insulating recess that is continuous with the heat insulating groove is formed in the heat dissipation member.

2. The circuit assembly according to claim 1, wherein the insulating layer has a filling portion with which a gap between the plurality of busbars is filled.

3. The circuit assembly according to claim 2,
    wherein an electronic component is mounted on the circuit board, and
    the filling portion is disposed in the vicinity of the electronic component.

4. An electrical junction box comprising the circuit assembly according to claim 2 and a case that accommodates the circuit assembly.

5. An electrical junction box comprising the circuit assembly according to claim 3 and a case that accommodates the circuit assembly.

6. The circuit assembly according to claim 1, wherein a heat dissipation grease is disposed in a region which is located between the insulating layer and the heat dissipation member, wherein at least one of the plurality of high-heat generating components is disposed over the heat dissipation grease.

7. An electrical junction box comprising the circuit assembly according to claim 6 and a case that accommodates the circuit assembly.

8. An electrical junction box comprising the circuit assembly according to claim 1 and a case that accommodates the circuit assembly.

* * * * *